United States Patent
Gaboury

(10) Patent No.: US 7,138,835 B1
(45) Date of Patent: Nov. 21, 2006

(54) METHOD AND APPARATUS FOR AN EQUALIZING BUFFER

(75) Inventor: Michael J. Gaboury, Burnsville, MN (US)

(73) Assignee: Xilinx, Inc., San Jose, CA (US)

(*) Notice: Subject to any disclaimer, the term of this patent is extended or adjusted under 35 U.S.C. 154(b) by 92 days.

(21) Appl. No.: 10/445,114

(22) Filed: May 23, 2003

(51) Int. Cl.
H03K 5/22 (2006.01)

(52) U.S. Cl. ............................. 327/77; 327/89; 327/63; 327/65; 327/67; 326/115; 326/117; 326/119; 326/121

(58) Field of Classification Search ................. 327/52, 327/51, 54; 330/9, 257, 258
See application file for complete search history.

(56) References Cited

U.S. PATENT DOCUMENTS

| | | | | |
|---|---|---|---|---|
| 6,028,480 A | * | 2/2000 | Seevinck et al. | 330/257 |
| 6,265,941 B1 | * | 7/2001 | Lopata | 330/258 |
| 6,426,676 B1 | | 7/2002 | Kuijk | 330/252 |
| 6,549,074 B1 | * | 4/2003 | Ugajin et al. | 330/258 |
| 6,624,698 B1 | * | 9/2003 | Nagaraj | 330/258 |
| 6,750,715 B1 | * | 6/2004 | Allott et al. | 330/258 |
| 6,812,784 B1 | * | 11/2004 | Michalski | 330/9 |
| 6,882,224 B1 | | 4/2005 | Gaboury | 330/253 |
| 2003/0141912 A1 | * | 7/2003 | Sudjian | 327/208 |

FOREIGN PATENT DOCUMENTS

| | | |
|---|---|---|
| JP | 2001-068951 | 3/2001 |
| WO | WO 03/009551 A2 | 1/2003 |

OTHER PUBLICATIONS

Jonh D. Lenk; Manual for Integrated circuit Users; Reston Publishing Company; 1973.*
Rob Howald; "When Good Frequencies Go Bad"; CommsDesign; Feb. 20, 2005; downloaded from URL: http://www.commsdesign.com/showArticle.jhtml?articleID=60402334; pp. 1-5.

* cited by examiner

Primary Examiner—Timothy P. Callahan
Assistant Examiner—Hiep Nguyen
(74) Attorney, Agent, or Firm—LeRoy D. Maunu; Michael Wallace

(57) ABSTRACT

A programmable, equalizing buffer is provided having feedback transistors used to vary the transfer function of the equalizing buffer, such that a low pass response of a transmission channel is substantially equalized. A zero in the buffer's transfer function is established by a conductive state of transistors caused by signal feedback. Multiple transistors establish increased flexibility for establishing the location of the zero, while a cascade of buffer stages provides a second order transfer function effective to cancel second order channel effects.

7 Claims, 7 Drawing Sheets

METHOD AND APPARATUS FOR AN EQUALIZING BUFFER

FIELD OF THE INVENTION

The present invention generally relates to current mode logic (CML) buffers, and more particularly to enhanced CML buffers that equalize a wideband input signal that has been subjected to high frequency attenuation.

BACKGROUND

Modern society depends upon electronic communication for many of its functions, where electronic communication may generally be divided between analog communications and digital, or discrete, communications. Digital communication has been the predominant form of communication in recent years.

Digital communication involves exchanging information using finite sets of signals. In practice, these signals may be electrical waveforms propagated from point to point, for example, along a controlled impedance transmission path of a printed circuit board (PCB). Other digital communication techniques use electromagnetic fields to propagate the information from one point to another through a free space medium.

Both free space and controlled impedance media, however, tend to modify information transmitted in an undesirable way before the information reaches the intended recipient. The transmission medium may be referred to as a channel that accepts a transmitted signal, S(t), and delivers an output signal, R(t), which is in general an imperfect rendition of signal S(t). The channel tends to corrupt the transmitted signal in one of two ways.

First, the channel may introduce noise into the transmitted signal from the electronic equipment used to perform the communication process. Other external noise processes, such as atmospheric electromagnetic noise and noise caused by other transmitted signals may significantly alter the transmitted signal. Second, the channel may distort the transmitted signal due to the physical limitations associated with the channel, e.g., the bandwidth limitations of a voice band telephone channel or the bandwidth limitations of a signal trace on a PCB.

Techniques exist today that attempt to minimize the effects of the channel on the transmitted signal. Some of these techniques lie within a process called source coding followed by a process of channel coding. Source coding is the process of accepting an original signal, such as discrete sequences, real numbers, or waveforms, and producing a sequence of symbols that represent the original signal. The sequence of symbols is generally characterized by a sequence of bits that represent the original signal in the best possible way given certain design constraints.

The channel coding process receives the source coded bit sequence and modulates the sequence according to a specific application. Example applications requiring specific modulation formats include Fibre Channel, Gigabit Ethernet, and Infiniband, to name only a few.

Regardless of the specific source and channel coding formats used, the resultant signal to be transmitted generally requires a greater bandwidth than was required by the original signal. Unfortunately, many channels exhibit a frequency dependent behavior, such that signal content at one frequency is attenuated differently than signal content at another frequency. In many cases, the channel tends to place a higher amount of attenuation on higher frequency content as compared to lower frequency content. Such a channel, therefore, is characterized by a low-pass frequency response, whereby content at the higher frequencies is distorted in magnitude to a larger degree than content at the lower frequencies.

The point at which the channel begins to significantly attenuate an input signal is called the cutoff frequency. The cutoff frequency is defined to be the frequency at which the magnitude of the output signal is attenuated by three decibel (dB) relative to a zero dB attenuation of the input signal. Frequency content that is higher in frequency than the cutoff frequency of the channel is attenuated in accordance with the transfer function, or frequency response, associated with the channel.

In order to compensate for the transfer function of the channel, an inverse to the channel transfer function is required at some point within the communication system such that the attenuation effects of the channel may be mitigated. One such placement within the communication system may be at the receiver of the transmitted signal. In such an instance, a receiver that counteracts the signal magnitude effects of the channel is said to equalize the effects of the channel. Thus, equalization seeks to render a substantially constant magnitude response across a specific bandwidth of interest regardless of a substantially non-constant frequency response provided by the channel.

Today's modulation formats, however, may require several gigabits to several tens of gigabits of bandwidth. The increasing bandwidths required by these modulation formats intensify the challenge to receiver hardware designers in providing receivers that not only are capable of receiving such wide bandwidth signals, but are also capable of equalizing the content of such wide bandwidth signals.

One such challenge is the implementation of a receiver design using standard glass epoxy PCBs. Each signal trace on the PCB is characterized as a transmission line, having a distributed reactance representative of a low pass filter having an upper frequency limit. As the bandwidth of the signals increases past this upper frequency limit, however, second order effects may cause a second corner frequency to exist, thus doubling the attenuation slope of the frequency response of the signal trace at the second corner frequency.

Each pole in the denominator of the transfer function of the signal trace causes a 20 dB per decade decrease in signal magnitude. That is to say, that if a particular signal trace provides a corner frequency at 100 megahertz (MHz) exhibiting a 3 dB decrease in signal magnitude, then a 23 dB decrease in signal magnitude is realized at 1000 MHz, or one frequency decade away from the corner frequency. In addition, second order effects may cause a second pole to exist at, for example, 5000 MHz, such that the magnitude of the signal begins to roll off at a 40 dB per decade slope at the second pole.

In order to offset the signal trace transfer function's pole effects, a receiving buffer is required to offset the attenuation caused by the signal trace. In particular, a receiving buffer is required that allows control of the receiving buffer's transfer function, such that zeroes in the numerator of the receiving buffer's transfer function may cancel the poles in the denominator of the signal trace's transfer function.

An apparatus and method that addresses the aforementioned problems, as well as other related problems, are therefore desirable.

SUMMARY OF THE INVENTION

An equalizing buffer is provided that includes an input circuit coupled to receive an input signal exhibiting attenuated content at a first frequency. The equalizing buffer further includes an active load coupled to the input circuit and coupled to provide an output signal in response to the input signal. Further, the equalizing buffer includes a feedback network coupled to the active load and coupled to receive a feedback control signal. The feedback network is arranged to substantially equalize the attenuated content in response to the feedback control signal.

An equalization circuit is provided that includes a means for receiving an input signal containing attenuated content at a corner frequency, a means for providing an output signal in response to the input signal, and a means for providing gain at the corner frequency in response to a feedback signal to substantially compensate for the attenuation at the corner frequency. The gain provided causes a substantially constant amplitude level of the output signal across a frequency band.

A method of operating an equalization buffer within a communication system having an attenuated frequency response at a first frequency is provided. The method includes establishing a first frequency response of the equalization buffer and modifying a feedback impedance within the equalization buffer in response to a feedback signal. The first frequency response exhibits an increased magnitude at the first frequency that is dependent upon the feedback impedance.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of frequency dependent equalization of a received signal. Embodiments of an enhanced buffer used to receive the signal are shown using complimentary P-type Metal Oxide Semiconductor Field Effect Transistor (PMOSFET) and N-type (NMOSFET) topologies. Those skilled in the art will appreciate that the invention could be implemented in other circuit topologies such as bipolar or bi-Complimentary Metal Oxide (biCMOS) circuit topologies.

Figure 1:
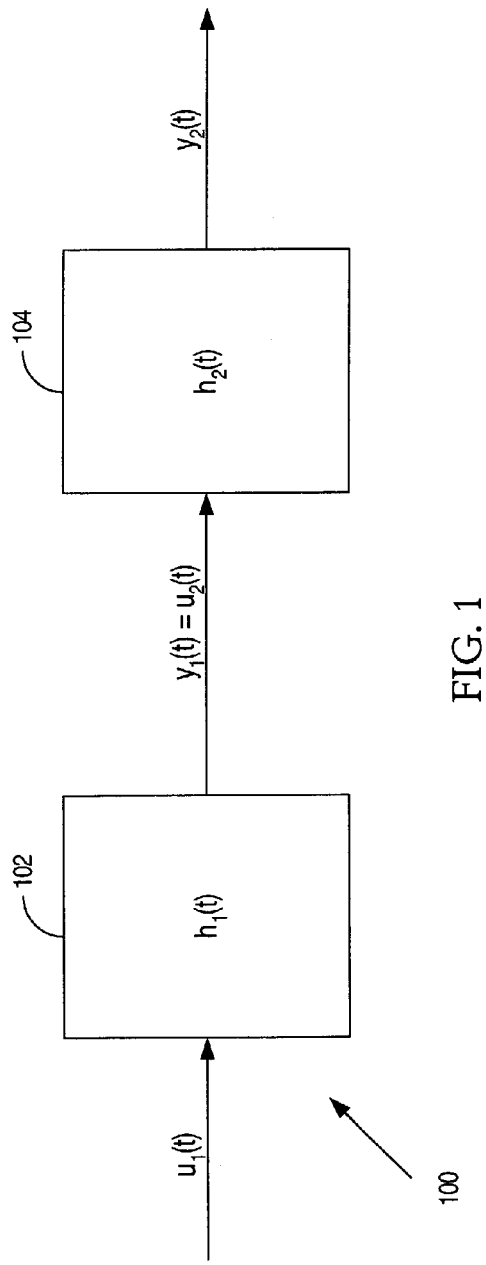
FIG. 1 illustrates a concatenation of system impulse responses.

FIG. 1 illustrates system 100, which is a concatenation of system functions 102 and 104 having impulse responses, $h_1(t)$ and $h_2(t)$, respectively. Impulse response $h_1(t)$ represents the impulse response of a transmission channel and $h_2(t)$ represents the impulse response of a receiving buffer in accordance with the present invention. In operation, channel 102 receives input signal $u_1(t)$ from a source/channel encoding device (not shown), such that $u_1(t)$ occupies a significant portion of bandwidth that must be supported by channel 102 for distortionless transmission. Signal $y_1(t)$ represents the output signal from channel 102, which also represents the input signal, $u_2(t)$, to receiving buffer 104. Signal $y_1(t)$ may be obtained through the convolution of $u_1(t)$ with the impulse response, $h_1(t)$, of channel 102. Likewise, signal $y_1(t)=u_2(t)$ is input to receiving buffer 104, where output $y_2(t)$ is derived through the convolution of $u_2(t)$ with the impulse response, $h_2(t)$, of receiving buffer 104.

Figure 2:
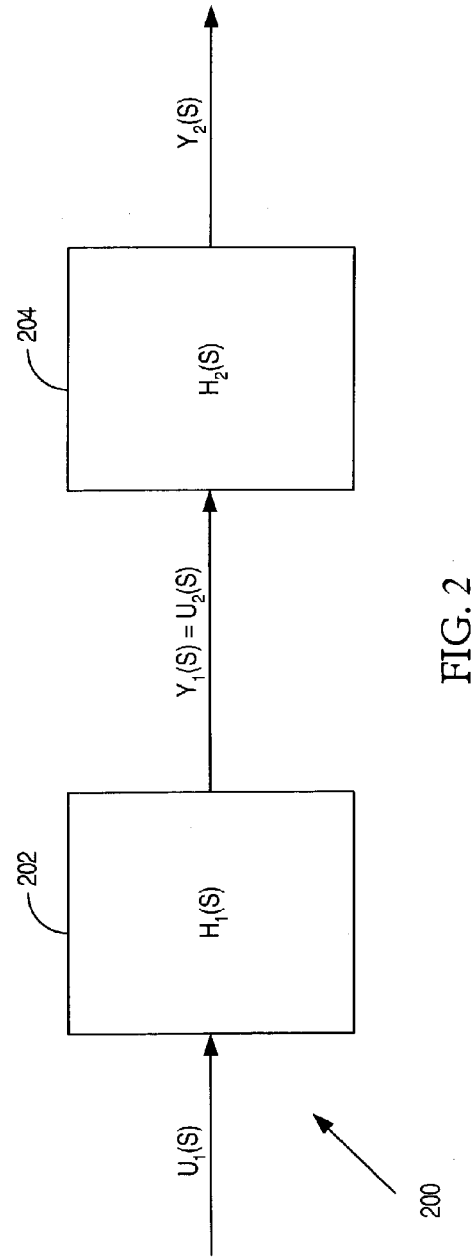
FIG. 2 illustrates a concatenation of system transfer functions.

FIG. 2 represents system 200 that is an alternative representation of system 100. System 200 illustrates, for example, that the Laplace transform of the impulse responses, $h_1(t)$ and $h_2(t)$, is taken to yield the transfer functions, $H_1(S)$ and $H_2(S)$, respectively. $H_1(S)$ represents the transfer function of channel 202, which is the Laplace transform of the impulse response, $h_1(t)$. $H_2(S)$ represents the transfer function of receiving buffer 204, which is the Laplace transform of the impulse response, $h_2(t)$. Expressions for $Y_1(S)$ and $Y_2(S)$ are described by equations (1) and (2) as follows:

$$Y_1(S)=U_1(S)H_1(S) \tag{1}$$

$$Y_2(S)=U_2(S)H_2(S) \tag{2}$$

In order to obtain an expression for $Y_2(S)$ in terms of the input signal $U_1(S)$, we combine equations (1) and (2) as follows:

$$\begin{aligned} Y_2(S) &= Y_1(S)H_2(S) \\ &= U_1(S)H_1(S)H_2(S) \end{aligned} \tag{3}$$

where $Y_1(S)=U_2(s)$. Thus, the transfer function of system 200 may be expressed as:

$$H(S)=Y_2(S)/U_1(S)=H_1(S)H_2(S) \tag{4}$$

In order to model the effects of system 200 on input signal $U_1(S)$, the transfer functions, $H_1(S)$ and $H_2(S)$ of channel 202 and receiving buffer 204, respectively, are all that is required.

One goal of the present invention is to obtain a result for $H(S)$ that is substantially equal to a constant, C, where $H_2(S)$ is programmed to be substantially equal to the inverse of $H_1(S)$, such that $$H(S)=H_1(S)*(1/H_1(S))\sim C \tag{5}$$

For example, if $H_1(S)=1/(S+A)$, then a single pole exists at $S=(-A)$ creating a corner frequency in channel 202 such that all frequency content greater than $S=-A$ is attenuated at a rate of 20 dB per decade. In order to equalize the effects of channel 202, receiving buffer 204 may be programmed to obtain transfer function $H_2(S)=S+A$. Such a transfer function provides a zero at $S=-A$, thereby canceling the effects of the pole provided by $H_1(S)$. System 200, therefore, yields a substantially flat frequency response over a given frequency band when the product of transfer functions $H_1(S)$ and $H_2(S)$ substantially equals a constant.

Figure 3:
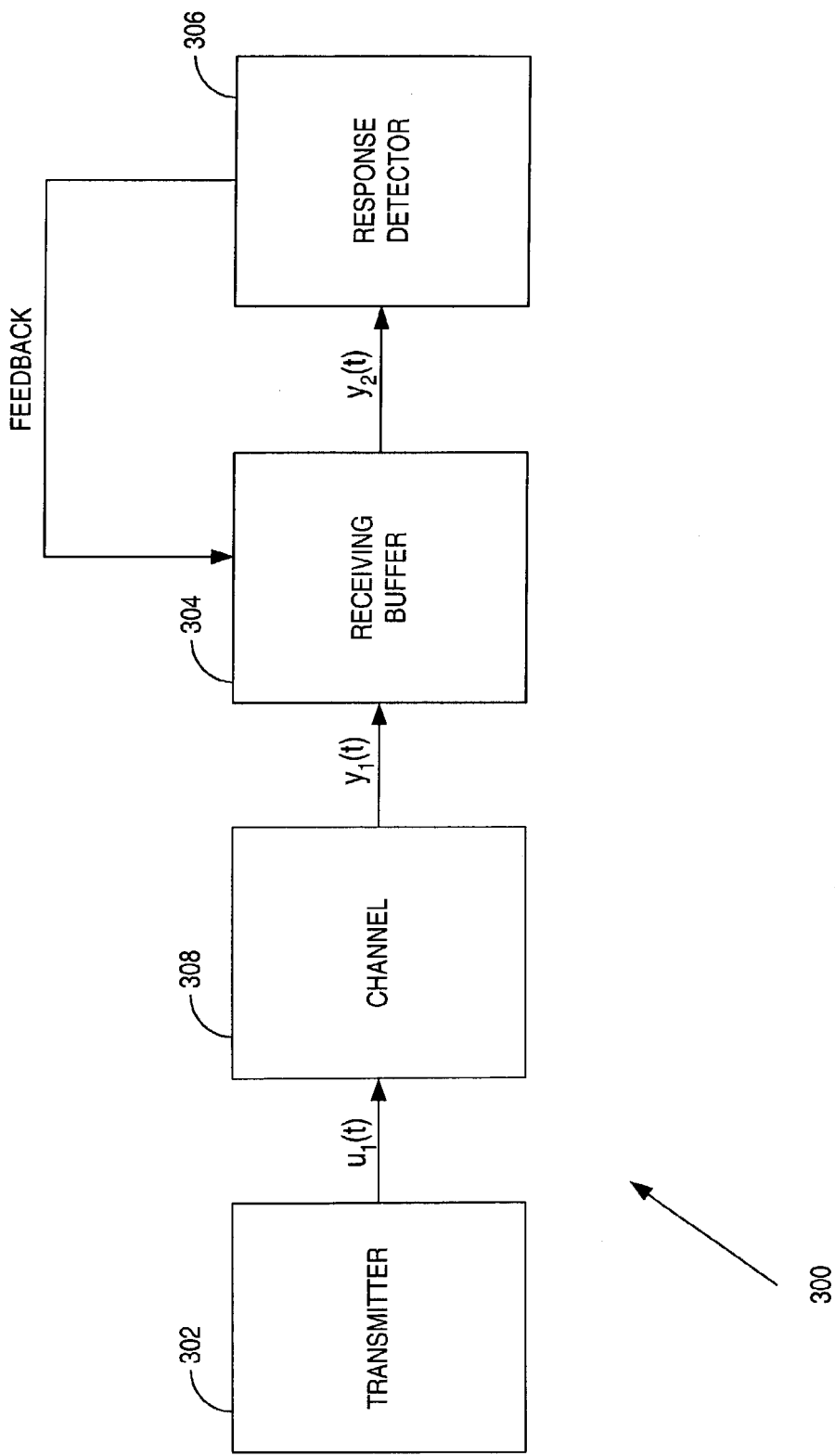
FIG. 3 illustrates a communication system in accordance with the present invention.

FIG. 3 illustrates communication system 300 according to the principles of the present invention. Communication system 300 facilitates the programming of the transfer function of receiving buffer 304, such that the transfer function of receiving buffer 304 approximates the inverse of the transfer function of channel 308. Transmitter 302 may constitute any number of transmitting entities including, for example, a driver circuit located on a PCB or a pulse code modulated (PCM) transmitter for use in an over the air transmission system. In the case where transmitter 302 is a driver circuit located on a PCB, channel 308 may correspond to, for example, a signal trace on the PCB that is coupled to the driver circuit. In the case where transmitter 302 is a PCM transmitter in an over the air transmission system, channel 308 represents free space. Those skilled in the art will appreciate that a channel may generally be considered to be any medium used as a conduit to transmit a signal from one point to another. The channel, therefore, may comprise a free space medium, an optical medium, or a medium that approximates the properties of a transmission line having a distributed characteristic impedance.

The lossless model of a transmission line includes a number of lumped circuit elements for each segment of transmission line under consideration. Each circuit element is modeled as a capacitor coupled between the signal trace and associated ground plane coupled in series with an inductor. As a signal propagates down the pair of transmission line conductors, each new section of transmission line acts electrically as a small lumped Low Pass Filter (LPF) circuit element. As each circuit element is lumped into the model, therefore, a new pole in the response of the transmission line is added. Thus in the limit, a transmission line may be comprised of an infinite number of poles. It is appreciated, however, that any compensation buffer, e.g. 304, that may be used to compensate for such a transmission line is physically limited as to the number of poles that can be compensated.

Receiving buffer 304 receives output signal, $y_1(t)$, from channel 308 and provides signal $y_2(t)$ in response to the impulse response of receiving buffer 304. Response detector 306 may constitute any number of implementations that are capable of providing signal FEEDBACK to receiving buffer 304. In a first embodiment according to the present invention, response detector 306 may consist of a technician monitoring signal $y_2(t)$ using, for example, a spectrum analyzer. In this case, response detector 306 manually adjusts signal FEEDBACK such that signal $y_2(t)$, or equivalently $Y_2(S)$, is proportional to the input signal $u_1(t)$, or equivalently, $U_1(S)$.

In another embodiment according to the present invention, response detector 306 may represent an automated function that produces an estimate for signal FEEDBACK based upon analysis performed on signal $y_2(t)$. Response detector 306 in this instance, may comprise for example, a transversal filter having multiple taps that are amplified, summed, and fed to a decision device that adjusts signal FEEDBACK to approach an overall system transfer function substantially equal to a constant.

Transmitter 302, in a first embodiment according to the present invention, may transmit a known training sequence to receiving buffer 304, whereby signal FEEDBACK is adjusted by response detector 306 to obtain signal $y_2(t)$ that is substantially proportional to training sequence $u_1(t)$. In another embodiment according to the present invention, response detector 306 continuously and automatically adjusts signal FEEDBACK to effect an adaptive equalization of signal $y_2(t)$.

Figure 4:
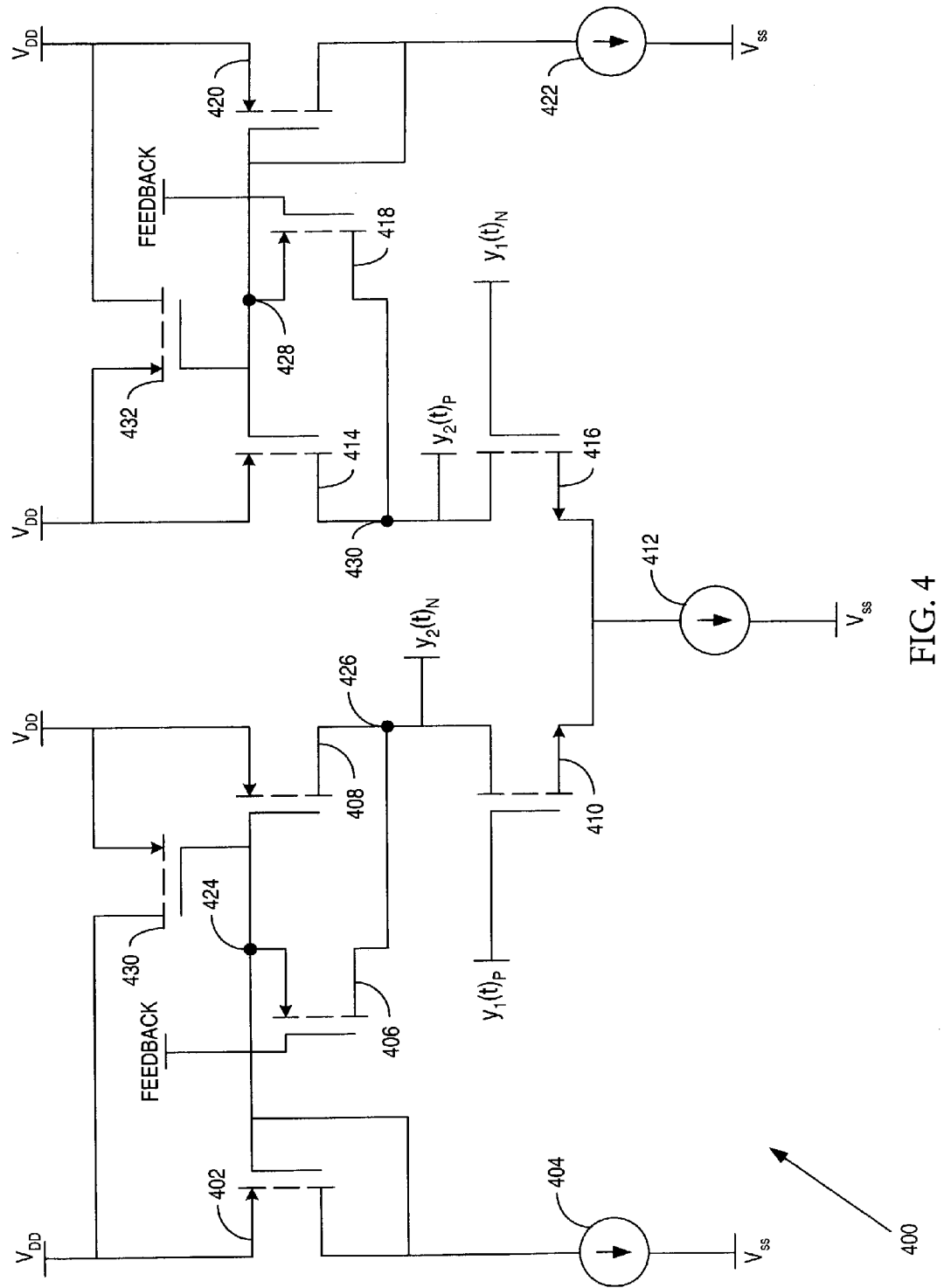
FIG. 4 illustrates an exemplary equalization buffer in accordance with the present invention.

FIG. 4 illustrates a schematic diagram of buffer 400 according to one embodiment of the invention. Buffer 400 is one example of receiving buffer 304 in FIG. 3. NMOSFET 410 and NMOSFET 416 are configured as a differential pair, coupled to receive input signal $y_1(t)_P$ and $y_1(t)_N$, respectively, where $y_1(t)_P$ and $y_1(t)_N$ are the differential version of signal $y_1(t)$ as illustrated in FIG. 3. The differential output of buffer 400 is generated at the drain terminals of transistors 410 and 416 as $y_2(t)_N$ and $y_2(t)_P$, respectively.

Buffer 400 is a symmetric circuit, where the left side of buffer 400 consists of feedback transistor 406 and an active load consisting of transistor 408, transistor 402 and current source 404. Similarly, the right side of buffer 4007 consists of feedback transistor 418 and an active load consisting of transistor 414, transistor 420 and current source 422.

Taking the left side of buffer 400 first, the drain terminals of transistor 408 and transistor 410 are coupled together at the drain terminal of transistor 406 at node 426. The source terminal of transistor 410 is coupled to a first conductor of current source 412 and a second conductor of current source 412 is coupled to power supply terminal $V_{SS}$. The source terminal of transistors 408 and 402 are coupled to power supply terminal $V_{DD}$. The source terminal of transistor 406 is coupled to the gate terminal of transistor 408, the gate terminal of transistor 402, the drain terminal of transistor 402, and a first conductor of current source 404 at node 424. A second conductor of current source 404 is coupled to power supply terminal $V_{SS}$. Transistor 430 is configured as a capacitor, such that the gate terminal is coupled to node 424, while the source and drain conductors of transistor 430 are coupled to $V_{DD}$.

Similarly, the right side of buffer 400 couples the drain terminal of transistor 414 and transistor 416 together at the drain terminal of transistor 418 at node 430. The source terminal of transistor 416 is coupled to a first conductor of current source 412. The source terminal of transistors 414 and 420 are coupled to power supply terminal $V_{DD}$. The source terminal of transistor 418 is coupled to the gate terminal of transistor 414, the gate terminal of transistor 420, the drain terminal of transistor 420, and a first conductor of current source 422 at node 428. A second conductor of current source 422 is coupled to power supply terminal $V_{SS}$. Transistor 432 is configured as a capacitor such that the gate terminal is coupled to node 428, while the source and drain conductors of transistor 432 are coupled to $V_{DD}$.

Buffer 400 operates in one of two modes of operation. A first mode of operation is defined when signal FEEDBACK is at a logic high level, such that the gate voltage of transistor 406 and 418 is at a positive potential with respect to the source terminal of transistors 406 and 418. Transistors 406 and 418 are, therefore, in a non-conductive state, whereby the connections at node pairs 424,426 and 428,430 are substantially open circuited. In a second mode of operation, signal FEEDBACK is at a logic low level, such that the gate voltage of transistor 406 and 418 is at a negative potential that is less than the threshold voltage with respect to the source terminal of transistors 406 and 418. Transistors 406 and 418 are, therefore, in a conductive state and the connections at node pairs 424,426 and 428,430 are substantially affected by the conductive state of transistors 406 and 418. In both modes of operation, transistors 430 and 432 provide an added component of capacitance in parallel with the gate terminals of transistors 408 and 414, respectively. As such, transistors 430 and 432 provide added flexibility in setting the position of the zeros in the transfer function of buffer 400. In addition, the capacitance of transistors 430 and 432 is configurable to allow even more flexibility in programming the transfer function of buffer 400.

In the first mode of operation, buffer 400 operates as a differential amplifier using an NMOS driver, e.g., transistors 410 and 416, and a PMOS active load, e.g., the combination of transistors 402 and 408 and transistors 414 and 420. Buffer 400 is symmetric, therefore, an analysis of only the left side of buffer 400 is required, since the operation of the right side of buffer 400 is identical to the left side operation. As the input voltage, $y_1(t)_P$, increases, the output voltage, $y_2(t)_N$ decreases. Conversely, as the input voltage, $y_1(t)_P$, decreases, the output voltage, $y_2(t)_N$ increases. The relationship between output voltage $y_2(t)_N$ given input voltage $y_1(t)_P$ is expressed by gain equation (6):

$$\frac{y_2(t)_N}{y_1(t)_P} = A_V = \frac{-g_{m410}}{1/r_{o410} + 1/r_{o408}} \qquad (6)$$

where $g_{m410}$ is the transconductance of transistor 410, and $r_{o410}$ and $r_{o408}$ are the output resistances of transistors 410 and 408, respectively.

Figure 5:
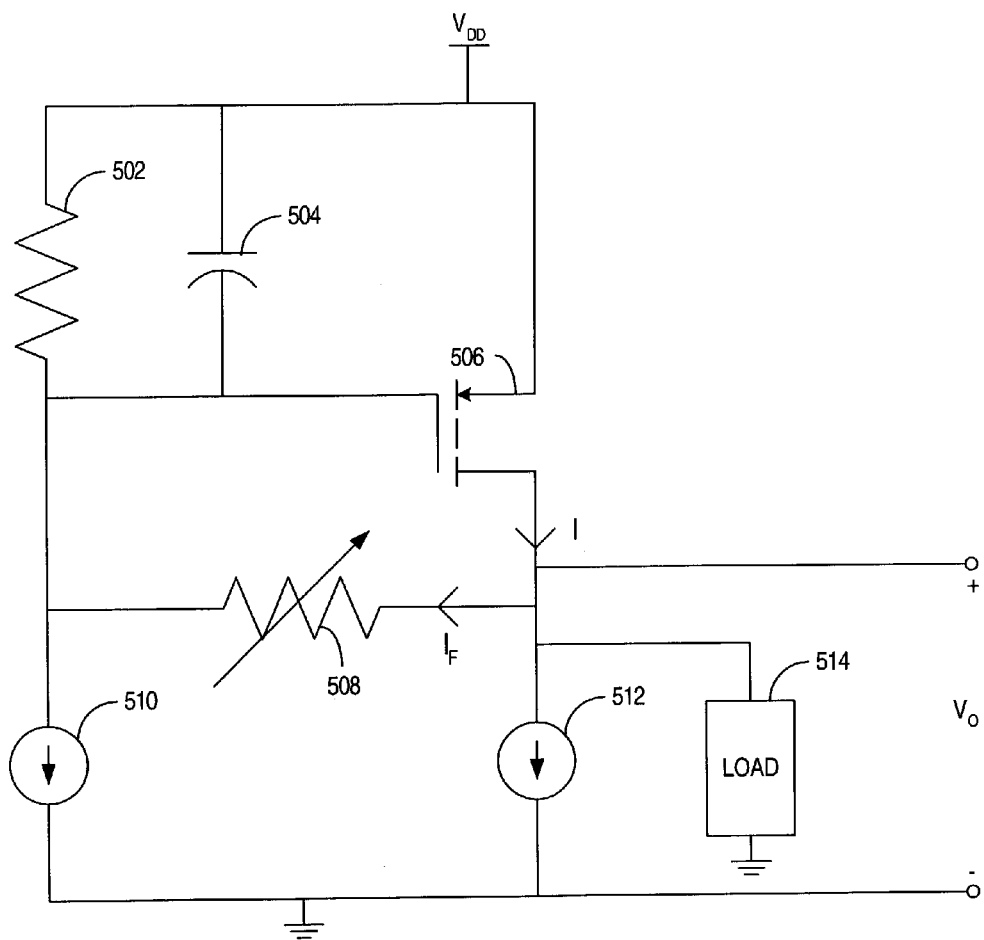
FIG. 5 illustrates an equivalent circuit of the equalization buffer of FIG. 4.

In order to analyze the second mode of operation of buffer 400, the effect of transistor 406 in its conductive state must be taken into account along with all other components on the left side of buffer 400. FIG. 5 illustrates an exemplary equivalent circuit of the left side of buffer 400 used to facilitate such an analysis.

Components in FIG. 5 represent functional equivalents to the circuit elements of FIG. 4, except that transistor 506 corresponds to transistor 408 of FIG. 4. Resistor 502 represents the on resistance of transistor 402. Resistor 508 represents the on resistance of transistor 406. Capacitor 504 represents the parallel combination of the gate capacitance of transistor 402, the source capacitance of transistor 406, the capacitance of current source 404, the capacitance of transistor 430, and the gate capacitance of transistor 408. Current source 512 represents the current conducted by, for example, transistor 410 in response to input signal $y_1(t)_P$. The signal related value of current source 512 is substantially equal to the product of the transconductance of transistor 410 and the magnitude of input signal $y_1(t)_P$.

The parallel combination of resistor 502 and capacitor 504 along with the series combination of resistor 508, implements a low pass filter function at the control terminal of transistor 506. The low pass filter being effective to reduce the effective impedance of load transistor 506 at low frequencies, thus decreasing the gain of load transistor 506 at low frequencies. As the frequency increases, so does the effective impedance of load transistor 506, thus increasing gain at the higher frequencies. By varying the resistance value of resistor 508, the transfer function of the low pass filter changes, and a variation of the frequency at which the gain begins to increase is effected.

It should be noted that although a single transistor 406 of FIG. 4 is illustrated as providing feedback resistance 508, multiple transistors may be implemented in many different configurations to generate feedback resistance 508. For example, multiple transistors may be parallel connected, i.e., source to source and drain to drain, each transistor receiving its own feedback control signal, e.g., FEEDBACK-1 through FEEDBACK-N. As each of the parallel connected feedback transistors is brought into its conductive state, the effective feedback resistance decreases due to the parallel orientation of the feedback transistors, thus decreasing the overall impedance of the feedback network. One of ordinary skill in the art will appreciate that many different configurations exist for the feedback network represented by resistor 508. It could be, for example, that a network of three transistors are parallel connected having geometries selected to provide a binary weighting, such that eight different resistance settings are achievable.

In order to provide a complete analysis of the operation of buffer 500, load 514 is considered. Load 514 may be characterized as a parallel combination of resistance and capacitance, where the resistance component is dominated by the on resistance of transistor 506. In addition, the capacitive component of load 514 is the combination of the gate capacitance of the next stage (not shown), the drain capacitance of transistor 408 and the drain capacitance of transistor 410.

Derivation of the original loop equations and the active resistances of equivalent circuit 500 allow the development of its transfer function. To begin, feedback current $I_F$ is calculated to be:

$$I_F = \frac{V_O}{Z_F} = \frac{V_O}{R_{508} + \frac{1}{g_{m502} + SC_{504}}} \qquad (7)$$

where $Z_F$ is the parallel combination of the inverse transconductance of transistor 402, represented by resistor 502, and capacitor 504, the parallel combination being connected in series with the on resistance of transistor 406, represented by resistor 508.

The output voltage developed across load 514 may be expressed as:

$$V_O = (I - I_F) * Z_L = \frac{I - I_F}{\frac{1}{R_L} + SC_L} \qquad (8)$$

where the load impedance, $Z_L$, is characterized as a parallel combination of resistance, $R_L$, and capacitance, $C_L$. The resistive component of $Z_L$ being dominated by transistor 506 and the capacitive component is the parallel combination of the next stage gate (not shown), the drain capacitance of transistor 410 and the drain capacitance of transistor 408. Substituting equation (7) into equation (8), we have:

$$V_O = \frac{I - \left[\dfrac{V_O}{R_{508} + \dfrac{1}{g_{m502}SC_{504}}}\right]}{\left[\dfrac{1}{R_L} + SC_L\right]} \qquad (9)$$

Derivation of the active resistances assumes that transistor 406, represented by resistor 508, and the load resistance, primarily represented by the resistance of the load transistor 506, are operating in their linear regions. The active resistance of resistor 508 may be expressed in terms of the channel parameters of transistor 406 and the applied voltage from signal FEEDBACK as follows:

$$R_F = \frac{1}{K\frac{W}{L}(V_{FB} - V_{TH})} = \frac{1}{KW} \frac{L}{V_{FB} - V_{TH}} \quad (10)$$

where K is a constant, W is the channel width of transistor 406, L is the channel length of transistor 406, $V_{FB}$ is the gate to source voltage magnitude across transistor 406 and $V_{TH}$ is the threshold voltage of transistor 406. Similarly, the expression for load resistance $R_L$ is:

$$R_L = \frac{1}{K\frac{W}{L}(V_G - V_{TH})} \quad (11)$$

where K is a constant, W is the channel width of transistor 506, L is the channel length of transistor 506, $V_G$ is the gate to source voltage of transistor 506 and $V_{TH}$ is the threshold voltage of transistor 506.

Returning to equation (9), and solving for the ratio of $V_o/V_i$, we have the following transfer function (12) associated with equivalent circuit 500:

$$\frac{V_0}{V_i} = H_o = \sqrt{K\frac{W}{L}I_D} * \frac{R_L(R_F g_{502} + R_F S g_{504} + 1)}{(R_F R_L C_{504} C_L)S^2 +} \quad (12)$$
$$(R_F R_L g_{502} C_L + R_L C_{504} +$$
$$R_L C_L + R_F C_{504})S +$$
$$(R_F g_{502} + R_L g_{502} + 1)$$

$$\text{setting } I = V_i g_{m512} = V_i \sqrt{K\frac{W_{512}}{L_{512}}I_{D512}},$$

where $W_{512}$ and $L_{512}$ are the width and length channel parameters of transistor 512, respectively, K is a constant, and $I_{D512}$ is the drain current of transistor 512.

Figure 6:
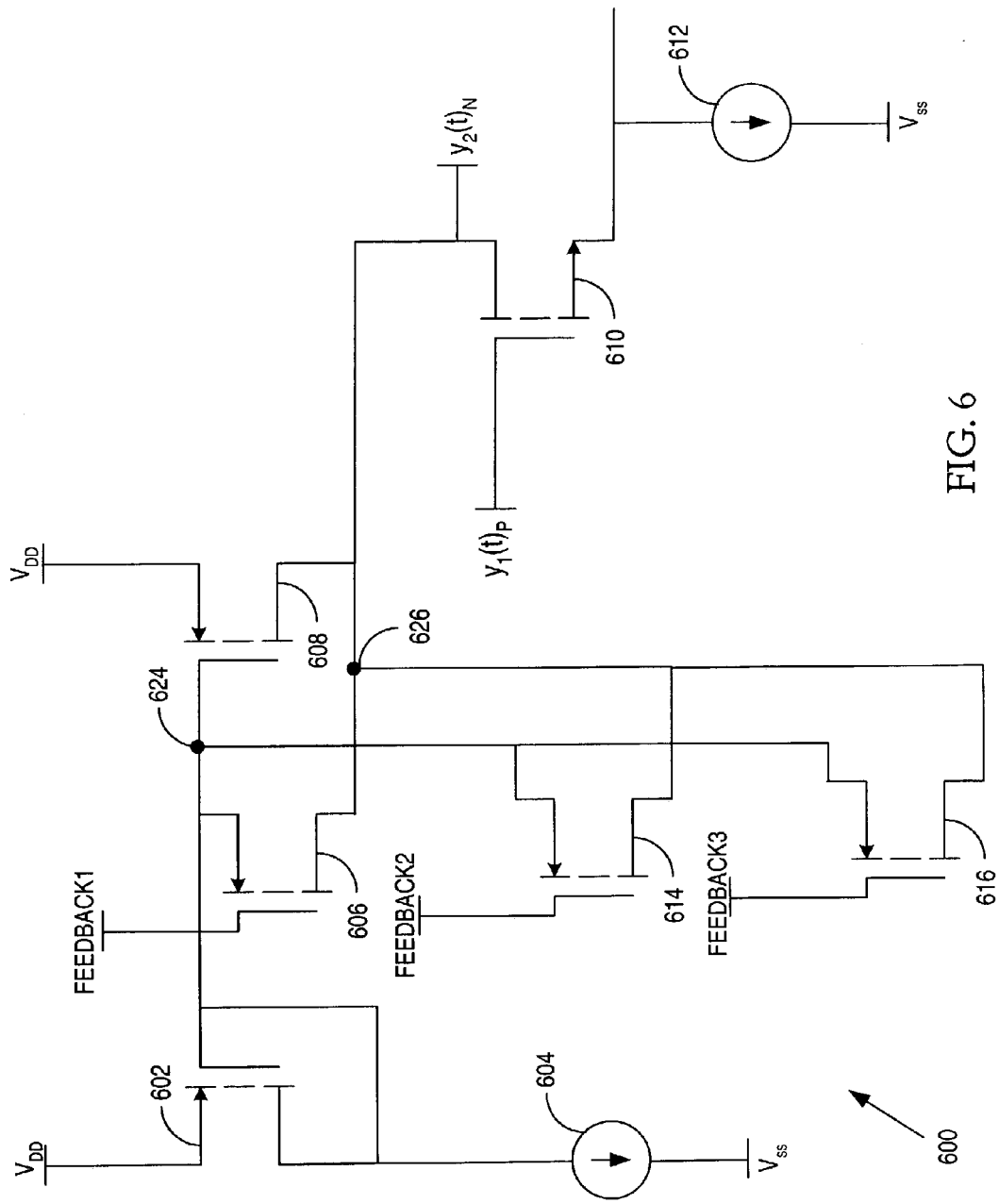
FIG. 6 illustrates another embodiment of an exemplary equalization buffer according to the present invention.

FIG. 6 illustrates one embodiment of equalizing buffer 600 according to the present invention. Buffer 600 is identical to the left side of buffer 400, except that buffer 600 utilizes three, parallel connected feedback transistors 606, 614, and 616. The conduction state of the three transistors 606, 614, and 616 are controlled using control signals FEEDBACK1, FEEDBACK2, and FEEDBACK3, respectively. Transistors 606, 614, and 616 may be represented as variable resistors, $R_{606}$, $R_{614}$, and $R_{616}$, when operated in their linear regions. Accordingly, the parallel combination of transistors 606, 614, and 616 may be modeled as a single resistor, $R_{EQ}$, whose resistance value is just the parallel combination of resistors $R_{606}$, $R_{614}$, and $R_{616}$, where $$R_{EQ} = \frac{1}{\frac{1}{R_{606}} + \frac{1}{R_{614}} + \frac{1}{R_{616}}} \quad (13)$$

$R_{EQ}$ is a variable parameter, yielding varying resistance values in response to the values of signals FEEDBACK1, FEEDBACK2, and FEEDBACK3. For example, when either of signals FEEDBACK1, FEEDBACK2, or FEEDBACK3 takes on a voltage level that is greater than the threshold voltage of transistors 606, 614, and 616, with respect to their source terminals, then transistors 606, 614, or 616 become non-conductive, thereby creating an open circuit across nodes 624 and 626. On the other hand, when the value of signals FEEDBACK1, FEEDBACK2, or FEEDBACK3 takes on a voltage level that is less than the threshold voltage of transistors 606, 614, and 616, with respect to their source terminals, then transistors 606, 614, and 616 become conductive, thereby creating an effective resistance across nodes 624 and 626 substantially equal to the parallel combination of resistances established by the conducting transistors.

It should be noted that the geometries of transistors 606, 614, and 616 may be established such that the resistive weighting established by each transistor may be varied. For example, the geometries for each of transistors 606, 614, and 616 may be set equal, such that the resistance values for each transistor are equal. The maximum resistance value of $R_{EQ}$ of equation (13), therefore, is established when only one of transistors 606, 614, and 616 is conducting, whereas the minimum amount of resistance is provided when all three transistors 606, 614, and 616 are conducting.

Alternatively, different geometries may be set up for each transistor to provide, for example, a binary weighting, whereby resistance values for each transistor are related by factors of 2. In this case, 3 feedback transistors 606, 614, and 616 are provided such that a total of $2^3=8$ combinations of resistances are available. It is appreciated by one of skill in the art, that any number of transistors and any number of weighting combinations of the transistors may be used. Accordingly, a substantially unlimited number of feedback network topologies exist such that the present invention may be adapted according to any specific application.

Figure 7:
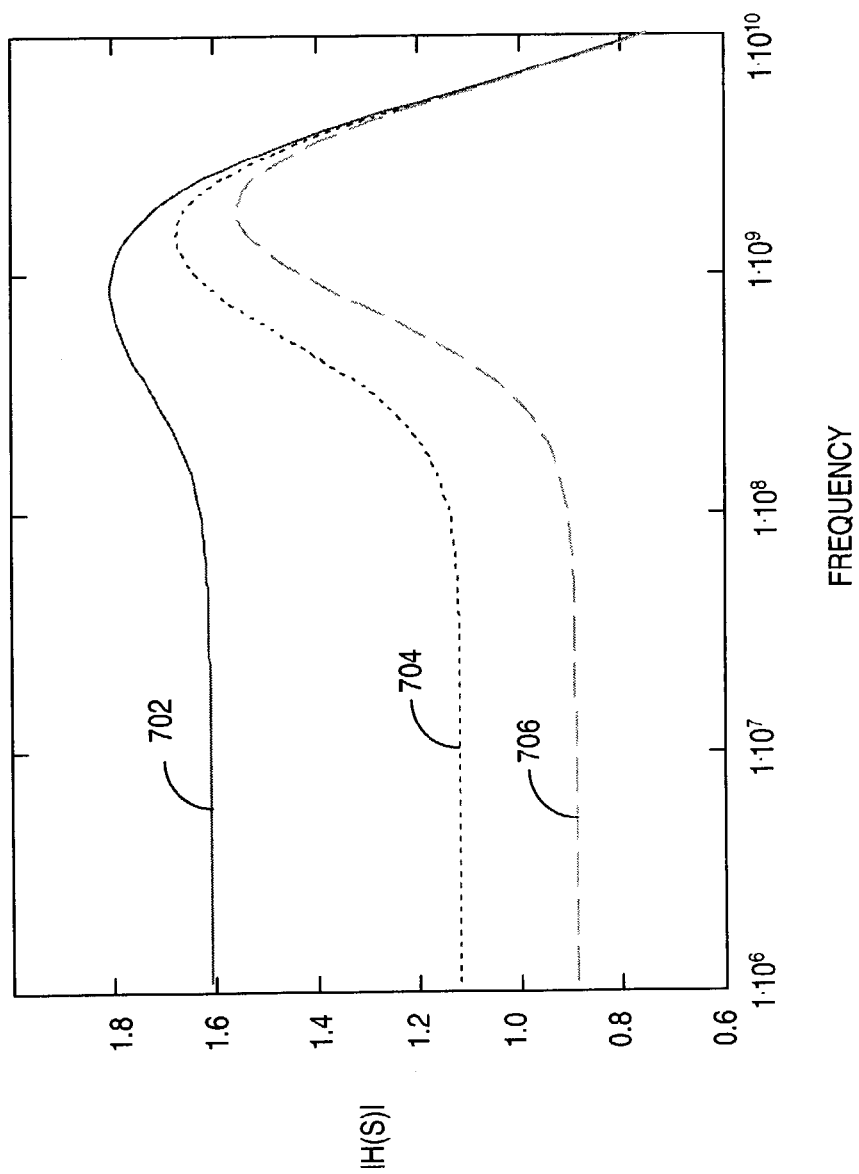
FIG. 7 illustrates exemplary gain plots of an equalization buffer according to the present invention.

FIG. 7 illustrates exemplary transfer function magnitude plots for the buffer circuit of FIG. 4 according to equation (12), where the feedback network is provided by a parallel combination of three feedback transistors as illustrated in FIG. 6. The geometries of transistors 606, 614, and 616 are configured to be identical, such that the resistance value provided by each transistor is equal for a given amount of gate to source potential.

Plot 702 corresponds to a maximum feedback resistance value, such that only one of transistors 606, 614, and 616 is conductive. The gain illustrated in plot 702 illustrates a relatively flat frequency response exhibiting a gain of approximately 1.6 out to approximately 100 MHz, where the gain begins to increase to a maximum of approximately 1.8 at 1 Gigahertz (GHz). Plot 704 represents the gain when two feedback transistors are conductive, such that a low frequency gain of approximately 1.1 to a maximum high frequency gain of 1.7 exists. Likewise, plot 706 represents the gain when all three transistors are conductive, providing the least amount of feedback resistance, such that a low frequency gain of approximately 0.9 and a high frequency gain of approximately 1.6 is achieved.

It can be seen, therefore, that by adjusting the magnitude of feedback resistance through controlling the conduction states of transistors 606, 614, and 616, the transfer function of buffer 400 may be programmed to provide decreasing gains at the lower frequencies and increasing gains at the higher frequencies. As such, the transfer function of buffer 400 may be programmed such that when combined with a transfer function of a given transmission channel, yields a substantially flat gain response over a very wide frequency range.

Figure 8:
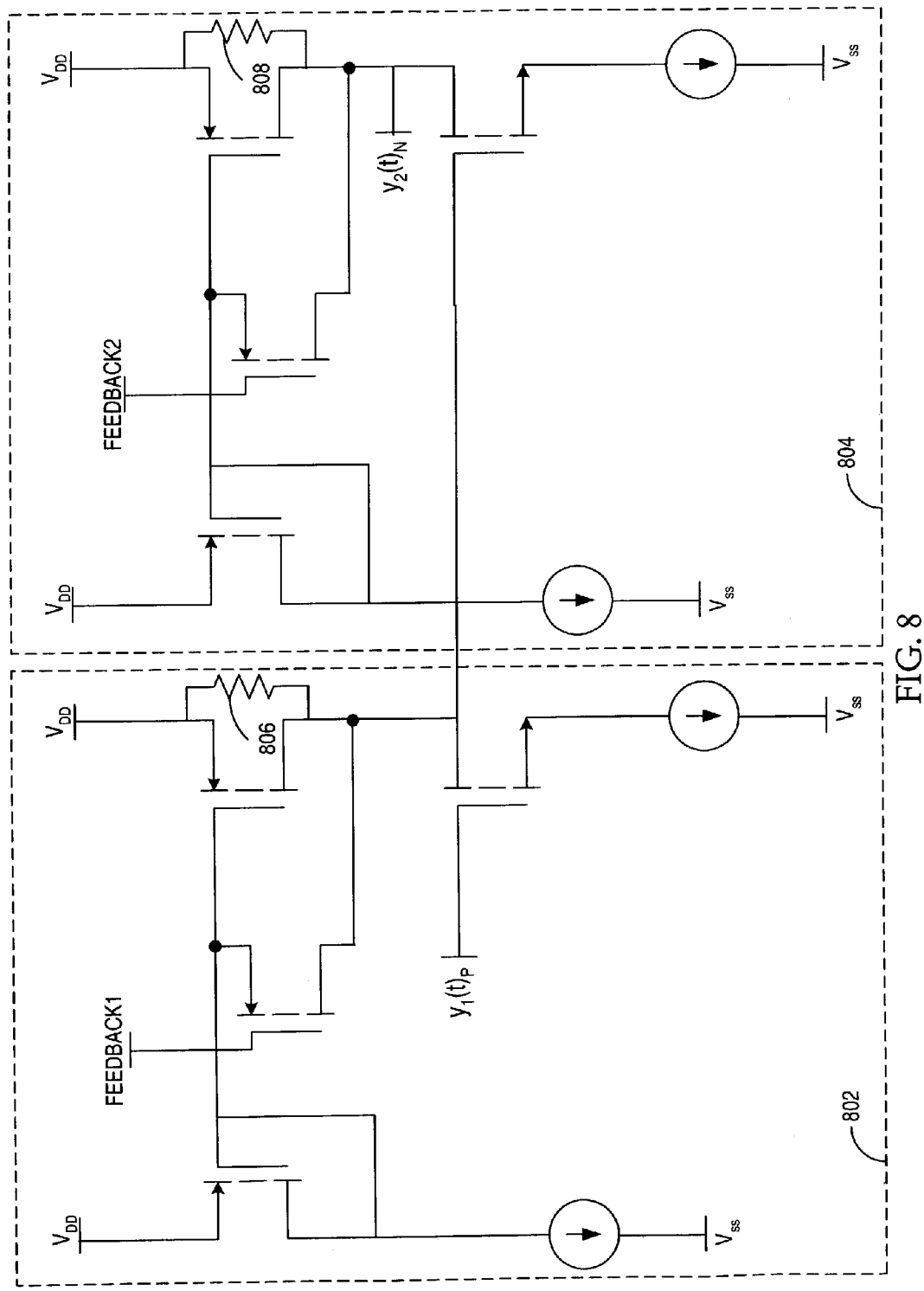
FIG. 8 illustrates another embodiment of an exemplary equalization buffer according to the present invention.

FIG. 8 illustrates another embodiment of an equalizing buffer according to the present invention. Stages 802 and 804 are each identical to the left side of buffer 400, with the exception that resistor 806 is coupled across the drain and source terminals of the load transistor of stage 802 and resistor 808 is coupled across the drain and source terminals of the load transistor of stage 804. Resistors 806 and 808 placed in parallel with the load transistors of each stage, allows the load transistors to be reduced in size, thus reducing the amount of load capacitance seen at the output of the buffer of FIG. 8, while maintaining substantially the same resistive load.

Stages 802 and 804 are coupled in series, such that a second order numerator exists in the transfer function of the cascade of stages 802 and 804 to provide two zeros. Each zero being programmable to match the low pass frequency characteristics of the transmission channel being equalized through appropriate selection of signals FEEDBACK1 and FEEDBACK2. The equalizing buffer topology exemplified in FIG. 8 is effective when equalization of a channel exhibiting higher order transfer function poles is required. The transfer function of stage 802 ($H_0(S)_{802}$), for example, may be programmed such that the zero established by $H_0(S)_{802}$ cancels the first frequency pole presented by the channel's transfer function. Similarly, the transfer function of stage 804 ($H_0(S)_{804}$), for example, may be programmed such that the zero established by $H_0(S)_{804}$ cancels the second frequency pole presented by the channel's transfer function.

It can be seen, therefore, that a cascade of N equalizing buffer stages presents a cascaded transfer function having an $N^{th}$ order numerator. Once each zero of the $N^{th}$ order numerator is programmed to cancel a corresponding pole of a channels Nth order denominator, a substantially constant frequency response is achieved.

The present invention is believed to be applicable to a variety of transmission systems, in particular those transmission systems utilizing glass epoxy PCBs and/or coaxial transmission mediums. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An equalizing buffer, comprising:
    an input circuit coupled to receive an input signal exhibiting attenuated content at a frequency, wherein the input circuit comprises a differential amplifier coupled to receive the input signal having first and second polarities, and
    wherein the differential amplifier comprises:
        a first transistor of a first conduction type having a control terminal coupled to receive the first polarity of the input signal and a first conductor coupled to a first node of the input circuit; and
        a second transistor of the first conduction type having a control terminal coupled to receive the second polarity of the input signal and a first conductor coupled to the first node of the input circuit;
    an active load coupled to the input circuit at a first output node and coupled to provide an output signal at the first output node in response to the input signal,
    wherein the active load comprises:
        a third transistor of a second conduction type having a first conductor coupled to a second conductor of the first transistor at the first output node; and
        a fourth transistor of the second conduction type having a first conductor coupled to a second conductor of the second transistor at a second output node; and
    a feedback network coupled across a control terminal of the active load and the first output node and coupled to receive a feedback control signal, the feedback network configured to substantially equalize the attenuated content in response to the feedback control signal and,
    wherein the feedback network comprises:
        a fifth transistor of the second conduction type having a control terminal coupled to receive the feedback signal, a first conductor coupled to the first output node and a second conductor coupled to a control terminal of the third transistor; and
        a sixth transistor of the second conduction type having a control terminal coupled to receive the feedback signal, a first conductor coupled to the second output node and a second conductor coupled to a control terminal of the fourth transistor.

2. The equalizing buffer according to claim 1, wherein an impedance value of the feedback network changes in response to the feedback control signal.

3. The equalizing buffer according to claim 2, wherein the feedback network comprises a plurality of variable impedance components, wherein each component receives a separate feedback control signal.

4. The equalizing buffer according to claim 3, wherein a change in impedance values of each of the plurality of variable impedance components effected by the separate feedback control signals is substantially equal.

5. The equalizing buffer according to claim 3, wherein a change in impedance values of each of the plurality of variable impedance components effected by the separate feedback control signals is substantially unequal.

6. The equalizing buffer according to claim 1, wherein the first and second transistors are n-type, Metal Oxide Semiconductor Field Effect Transistors(MOSFET).

7. The equalizing buffer according to claim 1, wherein the third, fourth, fifth, and sixth transistors are p-type, Metal Oxide Semiconductor Field Effect Transistors(MOSFET).

* * * * *